United States Patent [19]

Peterson

[11] 4,307,342

[45] Dec. 22, 1981

[54] METHOD AND APPARATUS FOR TESTING ELECTRONIC DEVICES

[75] Inventor: Karl E. Peterson, Mohnton, Pa.

[73] Assignee: Western Electric Co., Inc., New York, N.Y.

[21] Appl. No.: 58,035

[22] Filed: Jul. 16, 1979

[51] Int. Cl.³ .................... G01R 31/12; H03F 1/52
[52] U.S. Cl. ...................... 324/158 D; 324/158 R
[58] Field of Search .......... 324/158 D, 158 T, 158 R, 324/110; 330/207 P

[56] References Cited

U.S. PATENT DOCUMENTS

| | | | |
|---|---|---|---|
| 3,054,954 | 9/1962 | Boscia et al. | 324/158 T |
| 3,371,276 | 2/1968 | Schiff | 324/158 T |
| 3,978,405 | 8/1976 | Petree | 324/158 T |
| 3,979,672 | 9/1976 | Arnoldi | 324/158 T |
| 3,988,694 | 10/1976 | Yamazaki | 330/207 P |
| 4,075,549 | 2/1978 | Woodward | 324/418 |
| 4,091,434 | 5/1978 | Suzuki et al. | 330/207 P |
| 4,122,400 | 10/1978 | Mendendorp et al. | 330/207 P |

OTHER PUBLICATIONS

Sarles, Jr. et al.; "Balloon Flight . . . ", Review of Sci. Instruments, vol. 42, No. 3, Mar. 1971, pp. 346-353.

Primary Examiner—Ernest F. Karlsen
Attorney, Agent, or Firm—G. W. Houseweart

[57] ABSTRACT

A surge protector is tested by injecting a current spike with an exponentially decaying waveshape (12) through the surge protector. The current is generated by connecting a voltage source (16) to the surge protector and controlling the current through the surge protector by a Darlington array amplifier (20) connected between the surge protector and ground. The Darlington array amplifier (20) is in turn controlled by first generating a reference pulse having a voltage waveform corresponding to the desired current waveform and comparing this reference voltage with a voltage feedback from the Darlington array amplifier (20) to in turn generate an error voltage which is coupled into the amplifier (20). Additionally, differential amplifier circuits (44 and 46) monitor the voltage impressed on the amplifier (20) and reduce the input voltage to the amplifier (20) significantly if the voltage impressed on the amplifier (20) is greater than a predetermined fraction of the voltage source (16).

8 Claims, 3 Drawing Figures

METHOD AND APPARATUS FOR TESTING ELECTRONIC DEVICES

TECHNICAL FIELD

This invention relates to methods and apparatus for testing electronic devices, and more particularly to methods and apparatus for testing surge protectors.

BACKGROUND OF THE INVENTION

Surge protectors are used generally for protecting electronic equipment during undesirable high voltage surges such as occur when a circuit coupled to an electronic device is struck by lightning. The surge protector is generally placed in parallel with the equipment to be protected. Under normal ambient conditions the surge protector presents a high impedance and thus has essentially no effect on the electronic equipment. However, under high voltage surge conditions the surge protector becomes a low impedance to shunt the high current surges around the electronic equipment being protected.

Surge protectors are commonly used in telephone equipment, especially telephone equipment connected to above ground telephone lines. The surge protectors in this equipment are used principally to protect the equipment from the type of surges which occur when the telephone lines are struck by lightning. Surges induced on the telephone lines by lightning typically are of relatively high power and of relatively short duration. For example, the instantaneous power surge levels received by equipment connected to the telephone lines can extend into kilowatt levels with durations of peak power of less than a millisecond.

In the past, the generation of controlled power surges for testing surge protectors has been a problem due to the limitations of testing equipment. As a result, testing apparatus which test at less than full power or stress levels often have been used.

For example, U.S. Pat. No. 4,075,549 to Roger P. Woodward discloses a method of testing in which the voltage across a surge protector is continuously increased while the current through the surge protector is monitored. When the current through the surge protector increases rapidly, i.e., when the impedance of the surge protector decreases rapidly, the voltage across the surge protector at the time when the current surge occurs (the breakdown voltage) is recorded, and the voltage across the surge protector is immediately reduced by the tester.

While this method produces a threshold voltage measurement, such a test set does not simulate the actual conditions which a lightning surge places onto a surge protector. As a result some surge protectors fail in actual use due to the severe electrical stress placed on them. Fortunately, the vast majority of surge protectors fail by shorting permanently rather than by opening. The equipment is thus protected, but is rendered inoperable until the shorted surge protector is replaced.

In a telephone network, many lines can receive a voltage surge from a single bolt of lightning, thus exposing many surge protectors to a lightning surge. It can be readily appreciated that the cost of replacing defective surge protectors can be considerable. Thus a testing apparatus which produces a lightning simulation surge to eliminate devices which would fail in use is very desirable.

Another previously used testing method which more accurately presents a lightning surge type of test condition to a surge protector involves the use of a series RC circuit. In this type of test apparatus a large capacitor is charged with a voltage greater than the specified breakdown voltage of the surge protector under test. A switch is then closed, placing the surge protector and a resistor in series with the capacitor. The capacitor and resistor are chosen such that the initial current through a nominal surge protector typically is on the order of up to 100 amps. The current immediately starts to decay from the initial magnitude at an exponential rate, and the voltage across the surge protector is measured approximately 10 microseconds after the switch is closed. This type of testing is advantageous in that it provides a high peak power, short duration pulse as would be encountered by a surge protector protecting electronic equipment struck by lightning. The disadvantage with this test method is that the surge protector breakdown voltages can vary greatly from device to device, as much as 100% over nominal, and as little as a short circuit, i.e., zero. Thus, for a given series resistor the current through the surge protector often varies greatly and directly affects the accuracy of the breakdown voltage test and the stress induced in the surge protector.

Therefore, it can be appreciated that a surge protector test apparatus and method which accurately tests the characteristics of surge protectors under conditions similar to those produced by high voltage surges such as lightning is highly desirable.

SUMMARY OF THE INVENTION

It is therefore an object of this invention to provide a test set which produces accurate measurement of a surge protector.

It is also an object of this invention to provide a more accurate method of testing surge protectors.

It is another object of this invention to provide a method of testing surge protectors which simulates conditions occurring during a lightning caused surge.

It is still another object of this invention to provide a method of producing a lightning simulation for testing surge protectors.

To these and other ends, an apparatus for testing electronic devices in accordance with this invention includes a means for providing a reference pulse of a predetermined shape and duration which is compared in a comparator to a first feedback signal. The comparator circuit generates an error voltage in response to the comparison. An amplifier responsive to the error voltage controls the current flowing through a device and also generates the first feedback signal as an indication of the amount of current flowing through the device. A means is provided for monitoring the voltage across the device during at least a portion of the duration of the reference pulse.

Also in accordance with this invention is a method of testing an electronic device comprising the steps of generating a pulse of predetermined shape and duration, and comparing the pulse to at least a first feedback signal. An error voltage is generated in response to the comparison which in turn controls, with a Darlington array amplifier, the magnitude of current passing through an electronic device. The first feedback signal is generated as an indication of the current magnitude flowing through the device, and the voltage across the device is monitored during at least a portion of the duration of the pulse.

BRIEF DESCRIPTION OF THE DRAWING

The aforementioned and other features, characteristics, advantages, and the invention in general, will be better understood from the following more detailed description taken in conjunction with the accompanying drawing in which.

Figure 1:
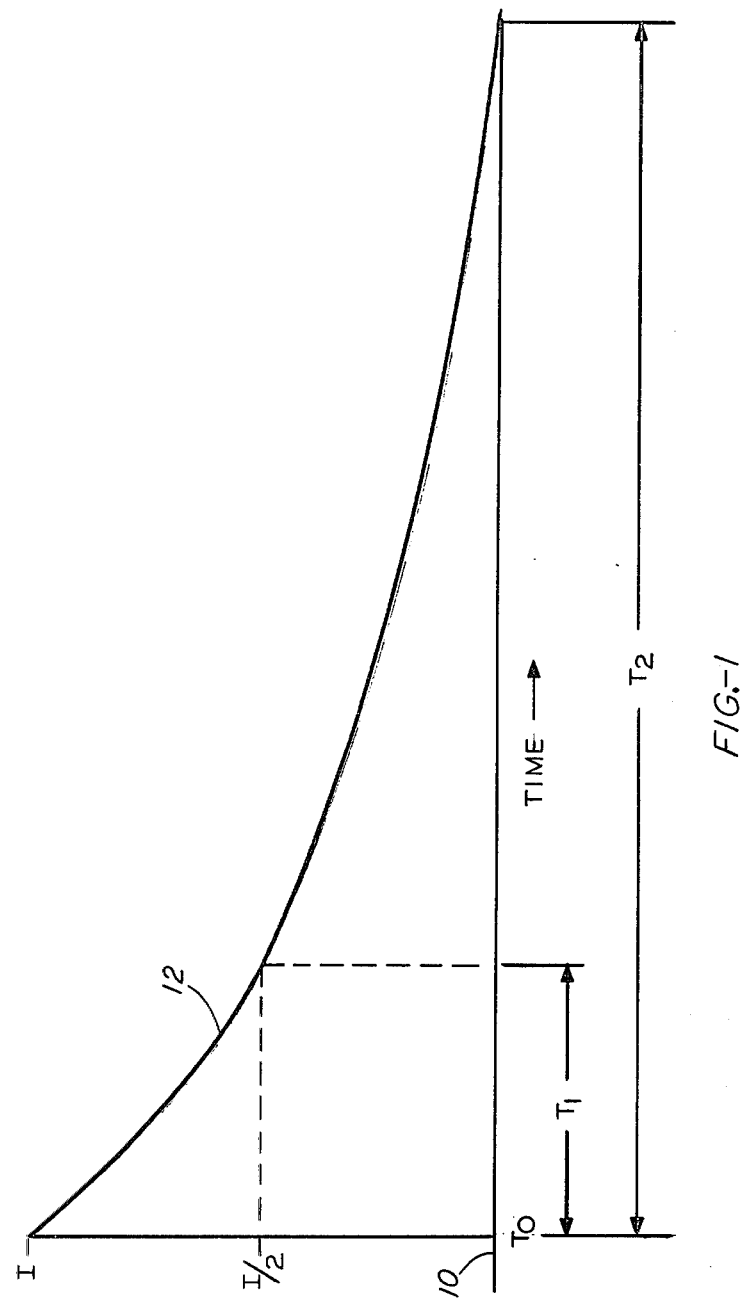
FIG. 1 is a graphical representation of the test current generated in the preferred embodiment.

It will be appreciated that for simplicity and clarity of explanation reference numerals have been repeated as considered appropriate in the figures to indicate corresponding features.

DESCRIPTION OF THE PREFERRED EMBODIMENT

Figure 2:
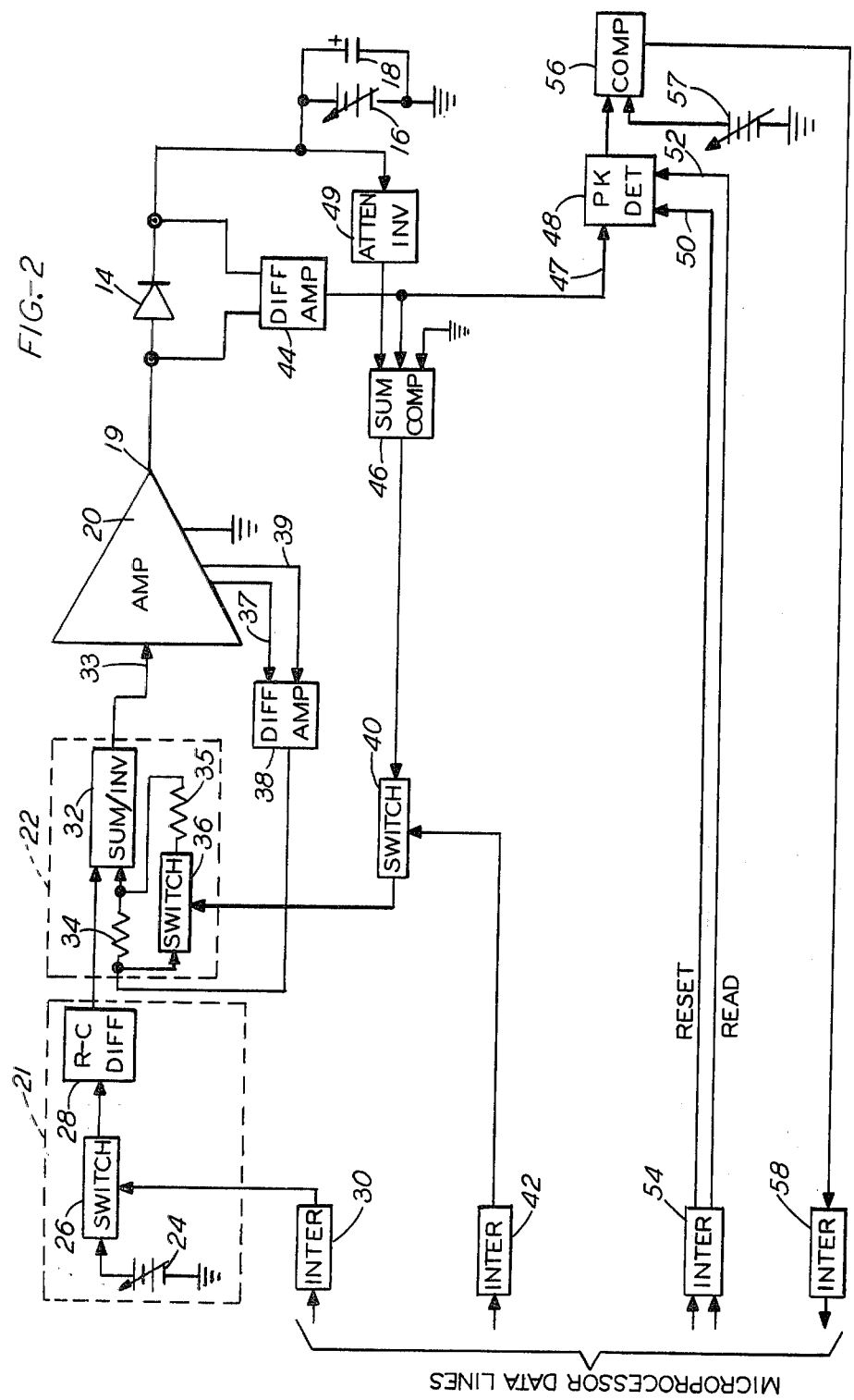
FIG. 2 is an electrical block diagram of the preferred embodiment of a surge protector testing apparatus according to the teachings of this invention.

Reference can now be had to FIG. 1 wherein a graphical representation is shown of a test current waveform or pulse which is used advantageously to test surge protectors in the preferred embodiment shown in FIG. 2. Time is plotted along the horizontal axis 10, and current magnitude is shown in the vertical direction. At time T0, a current begins to rise from a "zero" magnitude up to a magnitude of I which may, for example, be in the range of 10 to 100 amperes depending on the current range of the type of surge protector being tested. Immediately after the initial spike of current, the current magnitude, as shown by line 12, begins to decay at an exponential rate. The magnitude of the current decreases to a half value at time T1 which, in the preferred embodiment, is approximately one millisecond. The current continues to decay until a time T2 when the current pulse is terminated. The time T2 in the preferred embodiment is approximately seven milliseconds.

The current waveform shown in FIG. 1 is an approximation of the type of current pulse injected into a surge protector during a sharp overvoltage condition such as that caused by a lightning surge. It will be understood by those in the art that the current does not rise instantaneously in practice but rather has a finite risetime. The test current generated in the circuit of the preferred embodiment advantageously has a risetime on the order of ten microseconds.

FIG. 2 is a block diagram of a circuit for testing a surge protector in such a way that a current waveform of the type shown in FIG. 1 is passed through a surge protector and the breakdown voltage is measured during a portion of the current pulse. A surge protector 14 under test is connected between a parallel combination of a voltage source 16 and a storage capacitor 18 and a terminal 19 of an amplifier 20. Amplifier 20 operates as a controlled current sink for controlling the magnitude of the current through the surge protector 14 under test. The voltage source 16 and storage capacitor 18 supply the current which passes through the surge protector 14 under test and through the amplifier 20 to ground.

Amplifier 20 is controlled at an input 33 by a reference pulse generating circuit 21 in series with a comparator circuit 22. Reference pulse generating circuit 21 includes a voltage source 24, which is coupled through an electronic voltage controlled switch 26 and into an RC differentiator 28, the output of which is a voltage waveform of the shape, although inverted, shown in FIG. 1. Voltage controlled switch 26 is a solid state analog switch with interchangeable input and output terminals and a control terminal to turn the switch on (low impedance from input to output) or off (high impedance between input and output).

In the preferred embodiment the voltage controlled switch 26 is controlled by a microprocessor (not shown), through an interface circuit 30. The microprocessor can be selected from amoung a variety of commercially available ones, such as the device type designation 4040 as manufactured by INTEL Corporation, Santa Clara, Calif. Interface circuit 30 is well known in the art and provides signal conditioning for signals passing to and from the microprocessor.

The comparator circuit 22 includes a summing/inverter circuit 32 having one input from the output of RC differentiator 28 and having a second input from a first side of a parallel combination of a resistor 34 and the series combination of another resistor 35 and another electronic voltage controlled switch 36. The other side of the above parallel combination is connected to the output of a differential amplifier 38 which in turn receives signals from amplifier 20 on lines 37 and 39. The output of summing/inverter circuit 32 is connected to the input 33 of amplifier 20.

Electronic voltage controlled switch 36 is controlled by the output of a third electronic switch 40 which in turn is controlled by the previously mentioned microprocessor through a second interface circuit 42. Electronic voltage controlled switches 36 and 40 are of the same type as electronic voltage controlled switch 26. Also, interface circuit 42 is of the same general type as interface circuit 30.

The voltage across the surge protector 14 under test is detected by a differential amplifier 44, the output of which is fed into one input of summing/comparator circuit 46, and also into the input 47 of a peak detector 48. Peak detector 48 may be of a type such as Model 4085 manufactured by Burr-Brown Inc., Tuscon, Ariz. Summing/comparator circuit 46 sums the voltage from the output of differential amplifier 44 with the output of an attenuator/inverter circuit 49 and compares the sum to ground potential to provide an output voltage of either a predetermined positive voltage or ground potential. The input to attenuator/inverter circuit 49 is the supply voltage produced by voltage source 16. The output of summing/comparator circuit 46 is connected to the input of electronic voltage controlled switch 40.

Peak detector 48 receives, at second and third inputs 50 and 52, reset and read pulses, respectively, generated by the microprocessor and coupled to the peak detector through a third interface circuit 54. The output of peak detector 48 is coupled into one input of a comparator 56. A second input to comparator 56 is the output of a controllably variable voltage source 57. The magnitude of the voltage from source 57 determines the maximum acceptable peak voltage detected by peak detector 48. The output of comparator 56 is a pass or fail voltage indication and is coupled to the microprocessor through interface circuit 58. Interface circuits 54 and 58 are of the same general type as interface circuit 30.

All of the circuits shown as blocks in FIG. 2 are well known to those skilled in the art with the possible exception of RC differentiator 28 and amplifier 20. A preferred circuit for use as RC differentiator 28 comprises the commonly used combination of an operational amplifier with a series input capacitor, e.g., 0.1 microfarad, and with a feedback circuit including the parallel combination of a resistor, e.g., 7.5K ohms, a capacitor, e.g., 0.001 microfarad, and a diode having its anode connected to the output of the operational amplifier and its cathode connected to the input of the operational amplifier. When provided with a positive pulse at its input, such a circuit provides at its output an inverted version of the waveform shown in FIG. 1. Amplifier 20 is a Darlington array type of amplifier which will now be described in detail with reference to FIG. 3.

Figure 3:
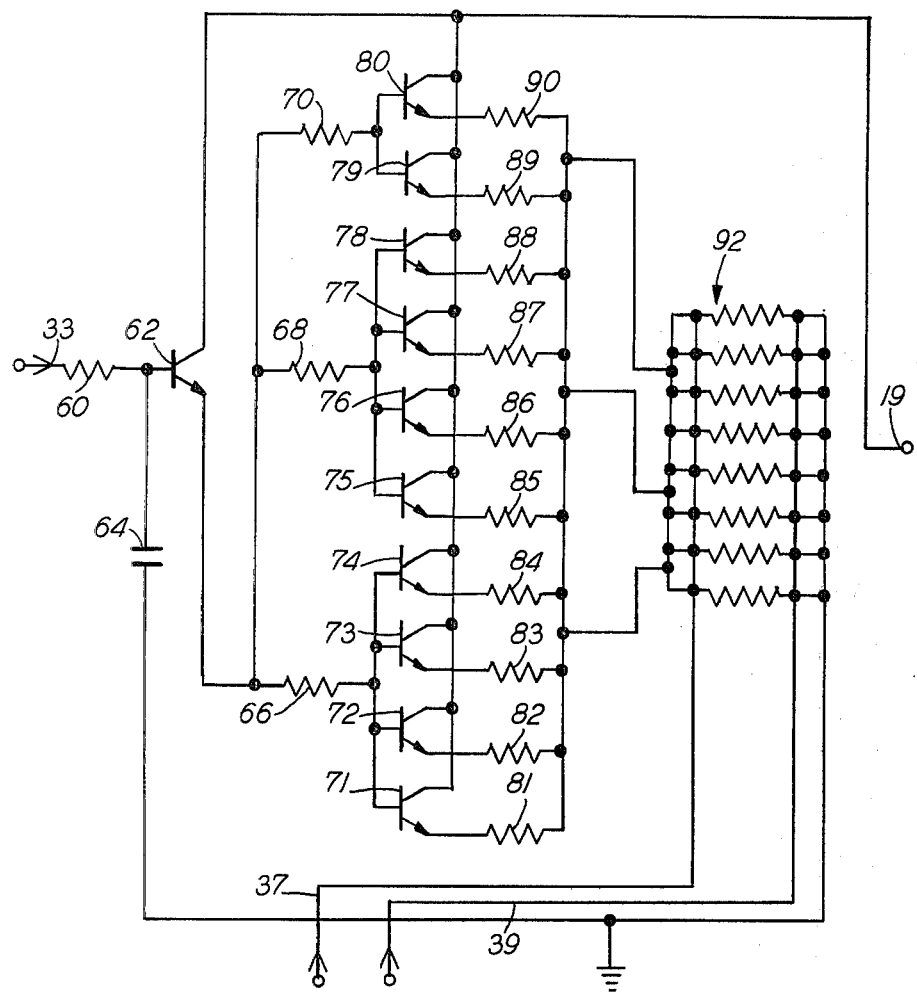
FIG. 3 is an electrical schematic diagram of the Darlington array amplifier shown in block form in FIG. 2.

As seen in FIG. 3, amplifier 20 has an input terminal 33 which is coupled through a resistor 60 into the base of a first stage transistor 62. The base of transistor 62 is shunted to ground by a capacitor 64. Shunt capacitor 64 is on the order of 300 picofarads in the preferred embodiment and is used in combination with resistor 60 to provide high frequency filtering. The emitter of transistor 62 is coupled through resistors 66, 68 and 70 to the bases of second stage transistors 71 through 80. Each of the emitters of transistors 71 through 80 is coupled through its own series resistor 81 through 90 respectively and into a first side of a resistor bank 92, formed by a plurality of parallel resistors. The opposite side of the resistor bank 92 is connected to ground. Two voltage pickoff connections placed across resistor bank 92 provide the feedback to amplifier 38 of FIG. 2 on lines 37 and 39. The collector of the first stage transistor 62 and the collectors of the second stage transistors 71 through 80 are connected together and to terminal 19.

In operation, a voltage at input terminal 33 (from summing circuit 32 of FIG. 2) is coupled through series resistor 60 and into the base of first stage transistor 62, which in turn provides current amplification to provide current into the bases of second stage transistors 71 through 80. Second stage transistors 71 through 80 amplify their respective base current to control the current flowing from terminal 19 through second stage transistors 71 through 80, through the series resistors 81 through 90, and through the resistor bank 92 to ground. Base resistor 60 operates to limit the current in the base of transistor 62 so that the amplifier does not provide too low an impedance to summing circuit 32 of FIG. 2. The base resistors 66, 68 and 70 of FIG. 3 are used to equalize the current to the base of transistors 71 through 80. The emitter resistors 81 through 90 are used to equalize the current through each of the second stage transistors 71 through 80, and the resistor bank 92 is used to develop a voltage which advantageously is proportional to the current flowing through terminal 19.

Ten second stage transistors (71 through 80) are used in the preferred embodiment to share the current from terminal 19 and allow each transistor to operate within its rated current capacity. Additional second stage transistors would tend to provide more operating margin but would have the detrimental effect of slowing the response time of amplifier 20. Thus the selection of ten second stage transistors has been found to provide a safe operating margin for each transistor in the circuit shown in FIGS. 2 and 3, and also provide an amplifier with transient response characteristics suitable for this application.

Lines 37 and 39 are advantageously placed across resistor bank 92 in a Kelvin connection as will be recognized by those in the art. In this manner the voltage appearing between lines 37 and 39 is not influenced by the solder connection resistance of the resistors of resistor bank 92.

In the preferred embodiment of FIG. 3, transistors 62 and 71 through 80 are of the type designated as DST 4075 as manufactured by the Delco Corporation, Kokomo, Ind., and are mounted on a copper plate which acts as a heat sink. Resistor 60 is 270 ohms and resistors 66 and 68 are 0.3 ohms while resistor 70 is 0.6 ohms. Resistors 81 through 90 are each a parallel combination of 0.3 ohm resistors such that the total resistance for each of resistors 81 through 90 is 0.1 ohm. Finally, the resistor bank 92 is comprised of eight resistors of 0.3 ohms each, providing a combined resistance of 0.0375 ohms.

With further reference now to FIG. 2, in operation, voltage source 24 provides a D.C. voltage level at the input of electronic switch 26. The microprocessor upon command places a pulse of a predetermined duration, for example, seven milliseconds, through interface circuit 30 and onto the control line of electronic switch 26. In this manner there is applied at the input of RC differentiator 28 a pulse which is equal in amplitude to the voltage provided by the supply voltage 24. RC differentiator 28 forms an inverted replica of the waveform shown in FIG. 1 from the voltage pulse, and this waveform is coupled into an input of summing/inverter circuit 32. Summing/inverter circuit 32 sums the output signal of RC differentiator 28 with a feedback signal responsive to the differential voltage between lines 37 and 39. The summed signal is inverted to form the output signal of summing/inverter circuit 32.

Since the summing/inverter circuit 32 sums a feedback signal and an inversion of a desired signal, the output signal of summing/inverter circuit 32 can be considered an error voltage which indicates the magnitude and polarity of error between the desired signal and the feedback signal. The output of summing/inverter circuit 32 is fed into the input 33 of amplifier 20 which controls the current entering terminal 19 of amplifier 20 and enables it to sink current from the surge protector 14 under test. The feedback voltage from differential amplifier 38 is coupled into summing/inverter circuit 32 and added to the output of RC differentiator 28 as described above to provide a current pulse into terminal 19 of amplifier 20 which is an inverted replica of the voltage out of RC differentiator 28. Thus advantageously the current through surge protector 14 under test and into terminal 19 of amplifier 20 is that shown and described with reference to FIG. 1. The current through the surge protector 14 is supplied by voltage source 16 and storage capacitor 18.

Since the magnitude of the output of RC differentiator 28 is proportional to the magnitude of the voltage at its input, it will be appreciated that the magnitude of voltage into the input 33 of amplifier 20 can be controlled by controlling the magnitude of the voltage of source 24. Since the test current is controlled by the input 33 of amplifier 20, voltage source 24 also controls the magnitude of the test current.

In a like manner, voltage source 16 is used to vary the amount of voltage placed across the surge protector 14 under test and amplifier 20 and is typically on the order of 50 to 125 volts, depending on the rating of the device being tested. The magnitude of the voltage supplied by the source 16 is made slightly larger than the sum of the voltage needed by amplifier 20 at terminal 19 and the maximum acceptable breakdown voltage of the surge protector. Amplifier 20, in the preferred embodiment, operates well when there is at least 20 volts between terminal 19 and ground. Thus, for a surge protector with a maximum rated breakdown voltage of 100 volts, a supply voltage of 125 volts has been found adequate for testing. Capacitor 18 must be large enough to supply at least most of the current during each test cycle, and in the preferred embodiment is 50,000 microfarads.

The current through the surge protector 14 under test is transformed in amplifier 20 into a voltage level which appears on lines 37 and 39, as is described in more detail above with reference to FIG. 3. The voltage appearing across lines 37 and 39 is amplified by differential amplifier 38 to form a feedback voltage. The output of amplifier 38 is fed back through either resistor 34 alone or, in combination with electronic switch 36 in series with resistor 35, and into summing/inverter circuit 32, where the feedback voltage is summed with the output voltage from RC differentiator 28. This feedback and summation/inversion insures that the current through the surge protector under test is proportional to that of the voltage out of RC differentiator 28.

Electronic voltage controlled switch 36 is disabled (turned off) by either the microprocessor through interface circuit 42 and switch 40, or by a low voltage output of summing/comparator circuit 46. At the beginning of the test pulse, during the first twenty microseconds in the preferred embodiment, the microprocessor, through interface 42, holds switch 40 off, which in turn holds switch 36 off. Thus the output voltage from differential amplifier 38 is coupled through resistor 34 alone and into summing circuit 32. The control of electronic switch 36 after the first twenty microseconds is described below.

Differential amplifier 44 picks off the voltage developed across the surge protector 14 under test, amplifies the voltage, and passes the amplified voltage to peak detector 48. At the appropriate time after the pulse begins (twenty microseconds in the preferred embodiment) the microprocessor signals, through the interface circuit 54 and input 52, peak detector 48 to read the voltage at the output of the differential amplifier 44. This voltage is then fed into comparator 56 when it is compared to a predetermined voltage provided by voltage source 57. Comparator 56 provides a pass/fail signal to the microprocessor via interface circuit 58 which indicates if the voltage from peak detector 48 is less than (pass) or greater than (fail) the voltage from the variable voltage source 57. After the current pulse has ended, the microprocessor sends another command through interface circuit 54 and to input 50 to reset peak detector 48 in preparation for the next test.

The delay time of twenty microseconds advantageously provides time (approximately ten microseconds) for the current pulse to rise initially to its peak value, plus another delay (also approximately ten microseconds) before the breakdown voltage measurement is made.

The output of differential amplifier 44 is also coupled to one input of summing/comparator circuit 46, where it is compared with the output of attenuator/inverter circuit 49 to determine if the voltage between ground and terminal 19 of amplifier 20 is greater or less than a predetermined portion of the supply voltage from voltage source 16. This determination is made by summing/comparator circuit 46 by adding the output voltage of differential amplifier 44 (equal approximately to the voltage across the surge protector 14 under test) to the output voltage of attenuator/inverter circuit 49. Attenuator/inverter circuit 49 inverts the voltage appearing across voltage source 16 and attenuates the voltage by a factor of approximately three in the preferred embodiment. If the sum is negative (i.e., amplifier 20 has more than approximately two-thirds of the supply voltage at terminal 19), summing/comparator circuit 46 applies a positive voltage to an input of electronic switch 40. If the difference is positive, a zero voltage or ground reference potential voltage is applied to electronic switch 40. The control terminal of electronic switch 40 is switched by the aforementioned microprocessor through interface circuit 42.

As described previously the microprocessor in the preferred embodiment inhibits the feedback signal from the summing/comparator circuit 46 for the first twenty microseconds of the test pulse. This twenty microseconds is also the delay before peak detector 48 reads the voltage across the surge protector 14 under test. After the voltage has been read, the microprocessor, through interface circuit 42, enables switch 40 which in turn couples the output voltage of summing/comparator circuit 46 to the control terminal of electronic switch 36. When the control terminal of electronic switch 36 receives a high voltage, the switch is activated or turned ON to place resistor 34 in parallel with resistor 35 to in turn increase the strength of the feeback signal from amplifier 38.

Advantageously, resistor 35 is approximately one-fourth the resistance of resistor 34. Thus, the amount of feedback is increased by approximately a factor of 5. Accordingly, at that instant in time the signal into the summing/inverter circuit 32 from the feedback is much greater than the voltage level from the RC differentiator 28, and the output of summing/inverter circuit 32 is accordingly decreased. This decrease in turn acts to lower the current through the surge protector 14 under test and through amplifier 20 by a factor of approximately 5. This lower current decreases the amount of power being dissipated by the amplifier 20, and thus the amplifier transistors are protected from being destroyed by excessive power dissipation.

If the current through amplifier 20 is not reduced by the feedback from differential amplifier 46, the test current continues to electrically stress the surge protectors. In this manner a more complete simulation of a lightning surge is realized. Thus the test circuitry described has the capability to test a normal surge protector with a lightning surge simulation and also to protect itself when a surge protector fails by shorting during the test.

As used presently each surge protector is tested to verify that the surge protector can withstand the electrical stress of a lightning type surge without destroying its usefulness. After each lightning surge test, a voltage leakage test is performed to verify that the surge protector has recovered from the simulated lightning surge.

The circuit shown in FIG. 2 has the advantage of presenting a lightning surge type of current to a surge protector under controlled conditions. This circuit can provide a peak power of 10 kilowatts across the surge protector 14 under test during the initial current pulse.

Although the invention has been described in part by making detailed reference to a certain specific embodiment, such detail is intended to be and will be understood to be instructive rather than restrictive. It will be appreciated by those in the art that many variations may be made in the structure and mode of operation without departing from the spirit and scope of the invention, as disclosed in the teachings contained herein. For example, the test current as shown in FIG. 1 may be modified as deemed appropriate to simulate other types of surge or overvoltage conditions. In another variation, amplifier 20 could be protected by monitoring the actual power being dissipated by the amplifier and by reducing the power being dissipated by amplifier 20 if the dissipated power is too large.

Also the microprocessor control as indicated with reference to FIG. 2 and discussions pertaining thereto, could be replaced by timed logic circuitry. With reference to FIG. 3, the number of transistors in the second stage of the Darlington arrangement can be increased or decreased depending on the specific voltages, currents and response time for each application as will be understood by those skilled in the art. Finally, although the invention has been described with reference to testing surge protectors, it will be understood that the test circuitry can be used in other applications requiring a well controlled test current.

What is claimed is:

1. Apparatus for testing electronic devices comprising:
    means for receiving a reference pulse with a predetermined shape and duration;
    comparison means for comparing said reference pulse to at least a first feedback signal and for generating an error voltage in response to said comparison;
    amplifier means responsive to said error voltage for controlling the current flowing through a device under test, and for generating said first feedback signal as an indication of the amount of current flowing through the device under test;
    means for monitoring the voltage across the device during at least a portion of the duration of said reference pulse; and
    means for protecting said amplifier means which comprises means for determining the voltage to said amplifier means and for providing a second feedback signal to said comparison means for decreasing said error voltage when the voltage applied to said amplifier means is above a limit.

2. Testing apparatus as set forth in claim 1 wherein said amplifier means is a Darlington array.

3. Testing apparatus as set forth in claim 1 including means for supplying the current flowing through the device and wherein said limit is a portion of a voltage produced by said means for supplying the current flowing through the device.

4. Testing apparatus as set forth in claim 1 wherein said reference means and said voltage monitoring means are adapted to be controlled by a microprocessor.

5. Testing apparatus as set forth in claim 1 wherein said testing apparatus is adapted for testing a surge protector and further including means for providing the reference pulse of a predetermined shape and duration in the form of a pulse having an initially relatively fast risetime to a predetermined amplitude followed by an exponential decay down to a reference potential.

6. A method of testing an electronic device comprising the steps of:
    generating a pulse of predetermined shape and duration;
    comparing said pulse with at least a first feedback signal;
    generating an error voltage in response to said comparison;
    sinking current passing through a device at a rate controlled by said error voltage;
    generating said first feedback signal as an indication of the current magnitude flowing through the device;
    measuring the voltage across the device at a predetermined time after the beginning of said pulse;
    determining whether the voltage across the device is above or below a predetermined limit;
    generating a second feedback signal to said comparator for indicating whether said predetermined limit has been exceeded; and
    decreasing said error voltage appreciably in said comparator when said second feedback signal indicates that the voltage across the device is below the predetermined limit.

7. A method of testing a surge protector comprising the steps of:
    (a) generating a voltage pulse having an initial negative peak voltage followed by an exponentially decaying waveform;
    (b) summing said inverted voltage pulse with a feedback voltage to form a first summed voltage;
    (c) inverting said summed voltage to form an error voltage;
    (d) coupling said error voltage to the input of a Darlington array amplifier to sink current from a voltage source through a surge protector;
    (e) transforming the magnitude of current flowing through said surge protector to a proportional magnitude of voltage to produce said feedback voltage;
    (f) detecting the voltage across the surge protector at a predetermined time during the duration of said voltage pulse;
    (g) comparing said voltage across the surge protector to a predetermined voltage to produce a pass/fail signal;
    (h) inverting the voltage across said voltage source to form an inverted supply voltage;
    (i) attenuating said inverted supply voltage to form an attenuated, inverted supply voltage;
    (j) summing said attenuated, inverted supply voltage to said surge protector voltage to form a second summed voltage; and
    (k) decreasing said error voltage if said second summed voltage is less than a reference potential and if said predetermined time has elapsed.

8. Testing apparatus as set forth in claim 1 further including means for supplying the current flowing through the device.

* * * * *